United States Patent [19]
Denny et al.

[11] Patent Number: 5,961,352
[45] Date of Patent: Oct. 5, 1999

[54] SHARED CARD SLOTS FOR PCI AND ISA ADAPTER CARDS

[75] Inventors: Ian McFarlane Denny, Greenock; Peter Andrew Smith, Skelmorlie, both of United Kingdom

[73] Assignee: International Business Machines Corporation, Armonk, N.Y.

[21] Appl. No.: 08/881,184

[22] Filed: Jun. 24, 1997

[30] Foreign Application Priority Data

Nov. 15, 1996 [GB] United Kingdom .................. 9623881

[51] Int. Cl.$^6$ ...................................................... H01R 9/09
[52] U.S. Cl. ............................................ 439/637; 361/785
[58] Field of Search ............................. 439/61, 636, 637, 439/631; 361/785

[56] References Cited

U.S. PATENT DOCUMENTS

| | | | |
|---|---|---|---|
| 3,193,791 | 7/1965 | Bock et al. | 439/637 |
| 5,122,073 | 6/1992 | Del Signore, II et al. | 439/218 |
| 5,192,220 | 3/1993 | Billman et al. | 439/327 |
| 5,360,346 | 11/1994 | Regnier | 439/61 |
| 5,558,522 | 9/1996 | Dent | 361/785 |

FOREIGN PATENT DOCUMENTS 0687983 12/1995 European Pat. Off. .

OTHER PUBLICATIONS

IBM Technical Disclosure Bulletin, vol. 39, No. 6, p. 129, Jun. 1996.
IBM Technical Disclosure Bulletin vol. 38, No. 3, Mar. 1995, p. 489.
IBM Technical Disclosure Bulletin vol. 38, No. 2, Feb. 1995, pp. 161–163.

*Primary Examiner*—Neil Abrams
*Attorney, Agent, or Firm*—Bernard D. Bogdon

[57] ABSTRACT

Personal computer motherboards commonly have connectors located on them for the insertion of plug-in adapter cards. Disclosed is a connector having a first opening in which a PCI adapter card may be inserted and a second opening in which an adapter card of a second type, such as an ISA or EISA card may be inserted. The connector has an insulating moulding common to the first and second openings. By using such a connector, the spacing between slots may be reduced from that required when separate PCI and ISA or EISA connectors are used. This allows either a lower profile for a personal computer or for more connection slots to be incorporated.

20 Claims, 6 Drawing Sheets

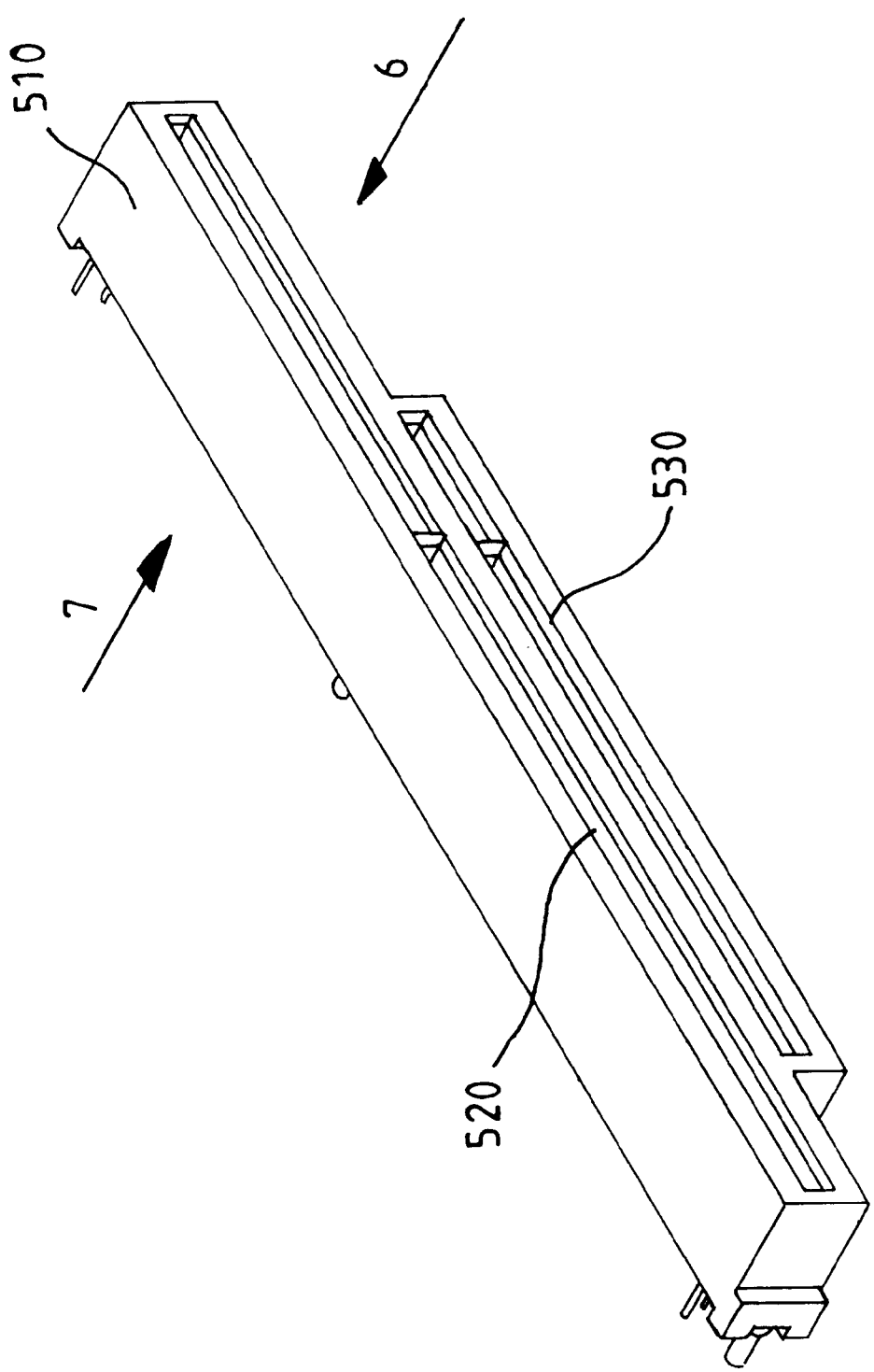

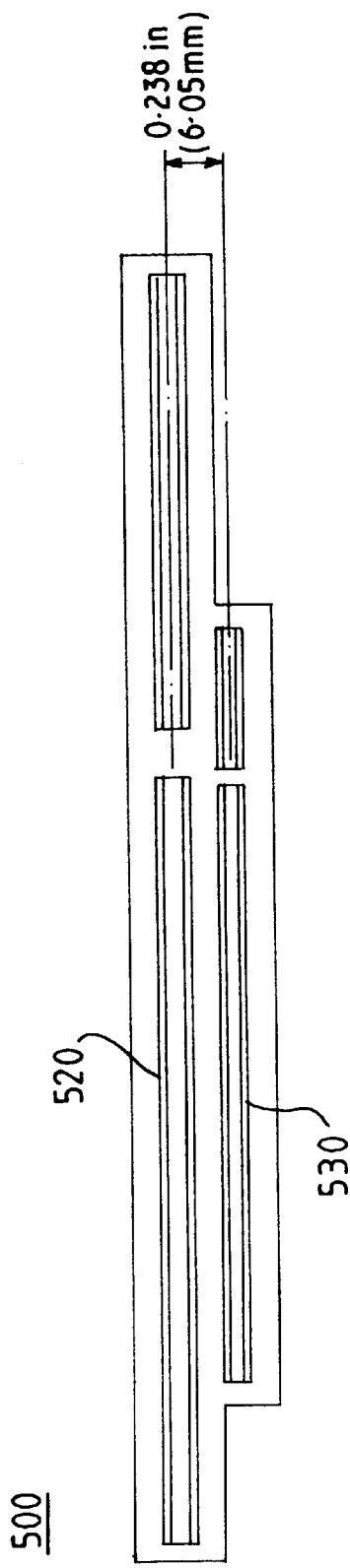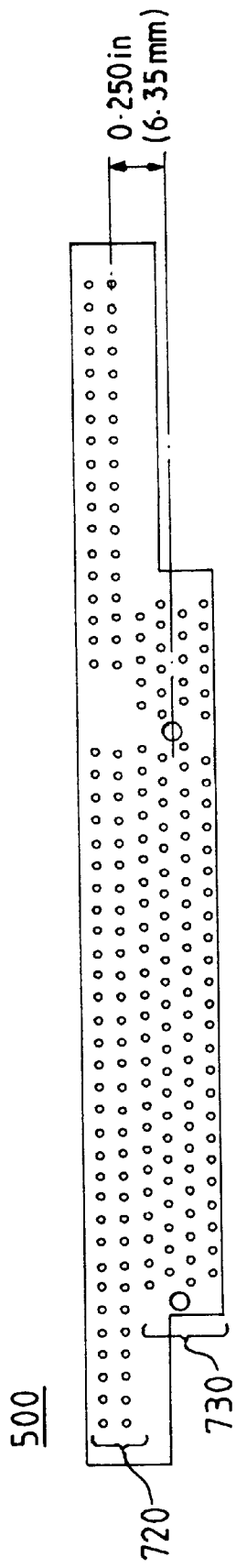

SHARED CARD SLOTS FOR PCI AND ISA ADAPTER CARDS

FIELD OF THE INVENTION

The present invention relates to computer adapter card connectors on a computer planar and more specifically to motherboard connectors which have connections for cards supporting the PCI standard and for cards supporting another standard, such as, for example, the ISA or EISA standard, within a common plastic moulding.

BACKGROUND OF THE INVENTION

Personal computer systems are well known in the art. Personal computer systems in general, and IBM personal computers in particular, have attained widespread use for providing computer power to many segments of today's modern society. These systems are designed primarily to give independent computer power to a single user and are inexpensively priced for purchase by individuals or small businesses. Personal computer (PC) can typically be defined as desktop, floor standing, or portable computers that includes a system unit having a single central processing unit (CPU) and associated volatile and non-volatile memory, including RAM and BIOS ROM.

One of the distinguishing characteristics of these systems is the use of a motherboard or system planar to electrically connect these components together and to provide for adapter or expansion cards to be added to the motherboard to perform any of a wide variety of functions. These functions may be options which a user may select at the time of ordering the computer and which are installed prior to the user installing the computer or they may be chosen by the user to add to his existing computer. Examples of the functions performed by adapter cards include additional video cards to provide enhanced video output to a system monitor, audio cards to provide for recordal, playback and editing of data relating to audio, communication cards such as a modem card or a Local Area Network (LAN) card to allow communication with other computers over a network or a fax card to allow fax transmissions to be sent and received. Additionally, such adapter cards may provide for more memory to be added to an existing computer than can be added to the motherboard. A system typically also includes a system monitor, a keyboard, one or more flexible diskette drives, a fixed disk storage drive (also known as a hard drive), a so-called mouse pointing device, and an optional printer.

Since personal computers first became popular in the early 1980's, most of these expansion cards were suitable for the so-called Industry Standard Architecture (ISA) type of computer bus. With the advent of more powerful computers having wider data bus widths and differing architectures and protocols an early enhancement to this bus called the Extended Industry Standard Architecture (EISA) was produced. Adapter cards for both of these types of bus consist of a printed circuit board with electronic components mounted on the circuit board, a number of contact strips provided along an edge of the circuit board which are intended to plug into a connector of the corresponding type (ISA or EISA) on the motherboard and a plate-shaped mounting bracket at one end of the circuit board to provide mechanical fixing of the card to the computer system and also to provide for the positioning of connectors to allow connections to external devices to be made. The printed circuit board has tracks to connect together the components as is well known in the art.

The connectors into which the adapter cards are inserted were located on the motherboard, with the cards being located perpendicular to the plane of the motherboard. This had the disadvantages that firstly the height of the enclosure in which the personal computer was contained could not be less than the height of the adapter cards plus some allowance for the motherboard and connector and secondly that the area of the motherboard was increased by the necessity to allow a considerable space for the connectors.

To overcome the first problem, a riser card is used in many systems today, in which the riser card has a number of contact strips provided along an edge of the card which are intended to plug into a connector on the motherboard. The riser card itself then has several connectors on it into which adapter cards are plugged in. The riser card is typically located perpendicular to the plane of the motherboard and the adapter cards are typically located perpendicular to the plane of the riser card, so that the adapter cards are located parallel to the plane of the motherboard. The height of the enclosure may now be reduced to be only that required for the motherboard itself and the thickness and spacing required to provide for as many adapter cards as it is desired to provide slots for on the riser card. In addition, since components may be placed on the motherboard underneath the adapter card location and since there is now only one connector on the motherboard for the riser card, the motherboard may itself be made smaller.

More recently, adapter cards have been available which have a so-called Peripheral Component Interconnect (PCI) bus. These have different contact arrangements and connectors and are not interchangeable with ISA or EISA adapter cards. On ISA and EISA cards, the components are mounted on the face of the card which is seen when the contacts along the edge are towards the user and the end plate carrying any external connectors is on the right hand side. On PCI cards, the components are mounted on the opposite side.

IBM Technical Disclosure Bulletin, Vol.38, No.3. March 1995, p.489 discloses a package that has two connectors attached to the same Input/Output Processor (IOP). The IOP has two connectors, one suitable for the PCI bus and one suitable for a MicroChannel (MC) bus. A card is plugged into either the PCI connector or to the MicroChannel connector. The IOP determines which connector is in use and configures the card accordingly.

IBM Technical Disclosure Bulletin, Vol.38, No.2. February 1995, pp.161–163 discloses a riser card having a first adapter slot which can be shared between either a MicroChannel adapter card and a PCI adapter card or between an ISA adapter card and a PCI adapter card. Three card slots are provided in total, but only the first may be shared.

Published European Patent Application EP-0-687-983-A1 discloses a riser card having a single card slot which has two connectors for that slot, one being an ISA connector and one being a PCI connector. Only a single card slot has the ability to accept an ISA adapter card or a PCI adapter card.

All of the above arrangements require the adjacent ISA connectors and the adjacent PCI connectors to have a spacing of around 1.00 inches (25.4 mm) in order to allow the connectors to be mounted in position. The cards themselves only require a 0.80 inch (20.3 mm) spacing to allow for the components on a card not to touch the opposite surface of an adjacent card. A disadvantage of the above arrangements is that the circuit board area which is used on the motherboard is larger for a given number of connectors as 1.00 inch (25.4 mm) spacing has to be allowed for. In an arrangement that uses a riser card, the height of the riser card has to be greater for a given number of connectors.

SUMMARY OF THE INVENTION

Accordingly, the invention provides a connector for use in a personal computer, the connector arranged so as to accept an adapter card, the connector having a first opening in which an adapter card of a first type may be inserted and a second opening in which an adapter card of a second type may be inserted, the connector having an insulating moulding common to said first and second openings, the adapter card of the first type having components substantially located on a first face of the card and the adapter card of the second type having components substantially located on a second face of the card.

The first type of adapter card may be a PCI adapter card and the second type of adapter card may be an ISA adapter card, an EISA adapter card or a MicroChannel adapter card or other card interface.

The insulating moulding of the connector is preferably formed from a plastic material. The plastic material is preferably glass filled polyester or nylon.

In a preferred embodiment the connector may be located on a personal computer motherboard in a closely spaced arrangement of a plurality of connectors. In such an embodiment, a greater number of card slots may be made available for a given area of circuit card, or in the alternative, a given number of slots may occupy a smaller card area. In an alternative embodiment, the connector may be located on a riser card for use in a personal computer, the riser card having a closely spaced arrangement of a plurality of connectors. In such an embodiment, a greater number of card slots may be made available for a given height of riser card, and hence enclosure, or in the alternative, the height of the enclosure may be less for a given number of slots.

BRIEF DESCRIPTION OF THE DRAWINGS

Embodiments of the invention will now be described, by way of example, with reference to the accompanying drawings, in which:

FIG. 5 shows a perspective view of a connector according to the present invention; and FIG. 6 shows a view of the connections of the connector of FIG. 5.

FIG. 7 shows connection details of the combined connector of the present invention.

DETAILED DESCRIPTION OF THE PREFERRED EMBODIMENTS

The invention may be implemented on a variety of personal computers or on mini computers which support a PCI bus and another bus, such as the EISA or ISA bus.

Figure 1:
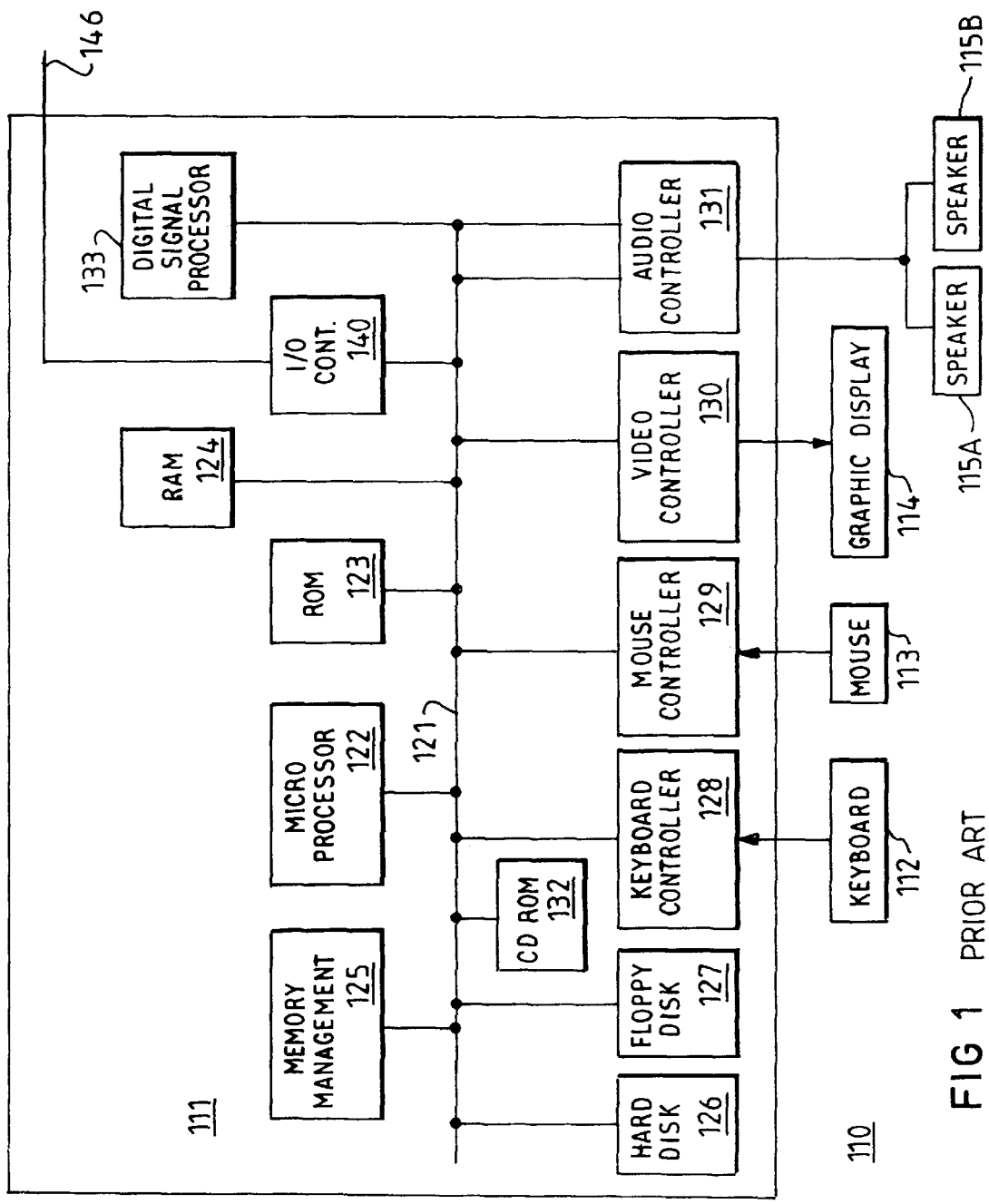
FIG. 1 is a block diagram of a prior art computer system in which the present invention may be used.

In FIG. 1, a prior art computer 110, comprising a system unit 111, a keyboard 112, a mouse 113 and a display 114 are depicted in block diagram form. The system unit 111 includes a system bus or plurality of system buses 121 to which various components are coupled and by which communication between the various components is accomplished. The microprocessor 122 is connected to the system bus 121 and is supported by read only memory (ROM) 123 and random access memory (RAM) 124 also connected to system bus 121. In many typical computers the microprocessors including the 386, 486 or Pentium microprocessors (Intel and Pentium are trademarks of Intel Corp.). However, other microprocessors including, but not limited to, Motorola's family of microprocessors such as the 68000, 68020 or the 68030 microprocessors and various Reduced Instruction Set Computer (RISC) microprocessors such as the PowerPC chip manufactured by IBM, or other microprocessors from Hewlett Packard, Sun, Motorola and others may be used in the specific computer.

The ROM 123 contains among other code the Basic Input-Output system (BIOS) which controls basic hardware operations such as the interaction between the CPU and the disk drives and the keyboard. The RAM 124 is the main memory into which the operating system and application programs are loaded. The memory management chip 125 is connected to the system bus 121 and controls direct memory access operations including, passing data between the RAM 124 and hard disk drive 126 and floppy disk drive 127. The CD ROM 132 also coupled to the system 121 is used to store a large amount of data, e.g. a multimedia program or presentation. CD ROM 132 may be an external CD ROM connected through an adapter card or it may be an internal CD ROM having direct connection to the motherboard.

Also connected to this system bus 121 are various I/O controllers: the keyboard controller 128, the mouse controller 129, the video controller 130 and the audio controller 131. As might be expected, the keyboard controller 128 provides the hardware interface for the keyboard 112, the mouse controller 129 provides the hardware interface for mouse 113, the video controller 130 is the hardware interface for the display 114, and the audio controller 131 is the hardware interface for the speakers 115a and 115b. An I/O controller 140 such as a Token Ring adapter card enables communication over a network 146 to other similarly configured data processor systems. These I/O controllers may be located on the motherboard or they may be located on adapter cards which plug into the motherboard, either directly or into a riser card. The adapter cards may communicate with the motherboard using a PCI interface, an ISA or EISA interface or other interfaces.

Figure 2:
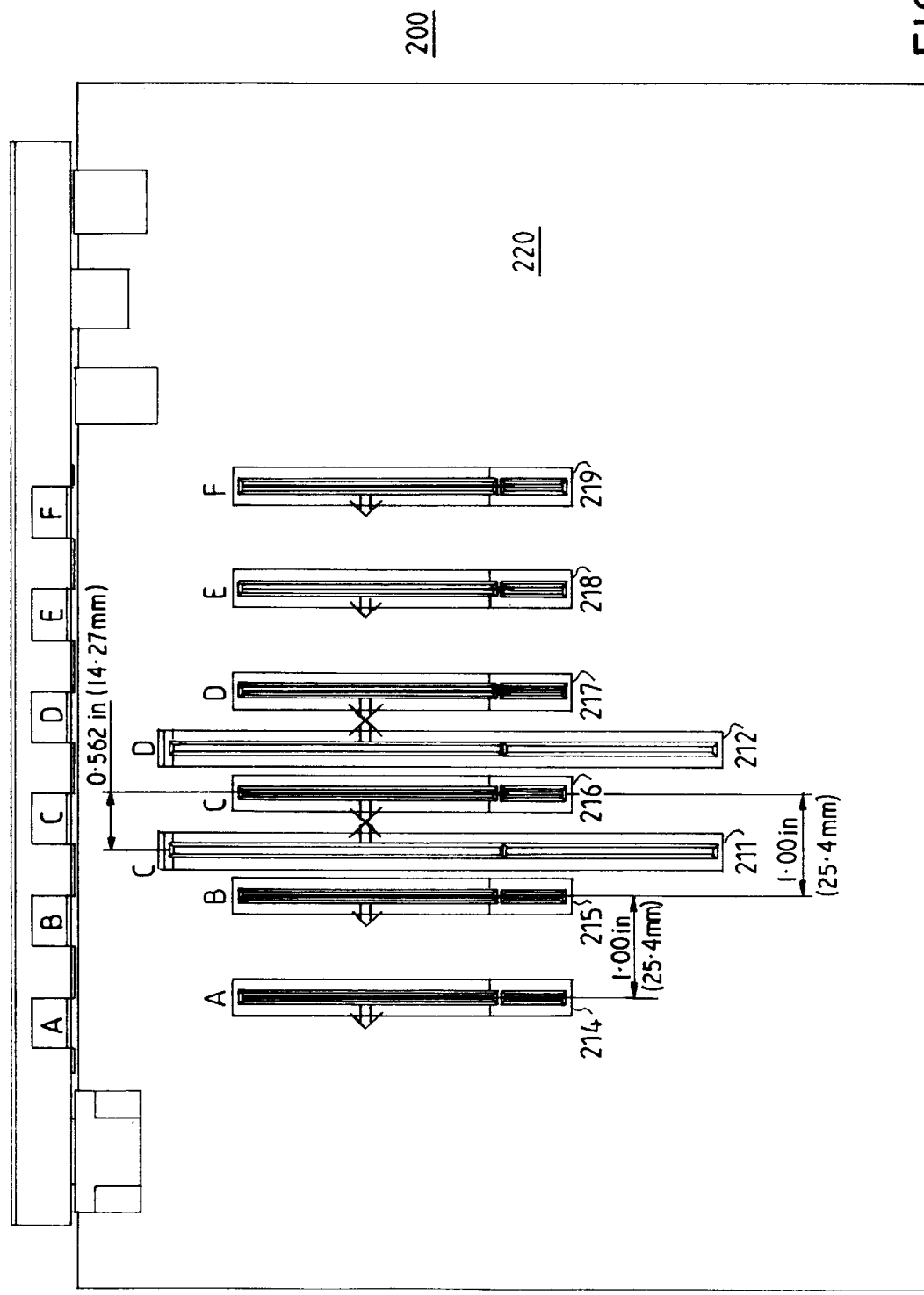
FIG. 2 is a diagram showing the spacing between adjacent connectors for EISA and for PCI cards located on a motherboard of a prior art system.

FIG. 2 shows a plan view of a prior art system 200 having a motherboard 220. The motherboard 220 has connectors 211 to 219 that allow up to six adapter cards to be located in the system in slots labelled from "A" to "F" in FIG. 2. This may be up to six PCI cards and up to two EISA cards, but limited to six cards in total. Connectors 211 and 212 are for EISA adapter cards for use in slots "C" and "D" respectively and connectors 214 to 219 are for PCI adapter cards for use in slots "A" to "F" respectively. Connectors 211 and 216 share an adapter card slot (slot C) and an adapter card may only be present in either one or the other connector. Similarly connectors 212 and 217 share a card slot (slot D).

A similar arrangement on a riser card mounted on a motherboard is known from the prior art, the riser card typically accommodating three adapter cards.

On ISA and EISA cards, the components are mounted on the face of the card which is seen when the contacts along the edge are towards the user and the end plate carrying any external connectors is on the right hand side. On PCI cards, the components are mounted on the opposite side. This allows the same positioning of the backplate fixing to be used for a single card slot which comprises both PCI and EISA connectors. In FIG. 2, the components on the PCI adapter cards and on the ISA or EISA adapter cards are on the surface shown by the arrow projecting away from the connector slot. A chassis has attachment points for the endplates attached to each of the cards.

PCI bus specifications specify that the spacing between card slots should be 0.80 in. (20.3 mm) to allow for the thickness of the card, the height of components from the surface of the cards and clearance to prevent the components coming into contact with adjacent cards. In addition, this spacing allows an airflow between the cards for the purposes of cooling the components. The spacing of 0.80 in. (20.3 mm) is needed between all adjacent cards. EISA and ISA bus specifications also have the same requirement of 0.80 in. (20.3 mm) for card spacing. For MicroChannel cards, the corresponding spacings are 0.85 in. (21.59 mm).

However, when a shared card slot is present, such as the slot labelled as slot C and shared by connectors 211 and 216 in FIG. 2, the spacing between adjacent slots must be increased to 1.00 in. (25.4 mm) in order to prevent a PCI connector 216 making contact with an adjacent ISA connector 212.

Figure 3:
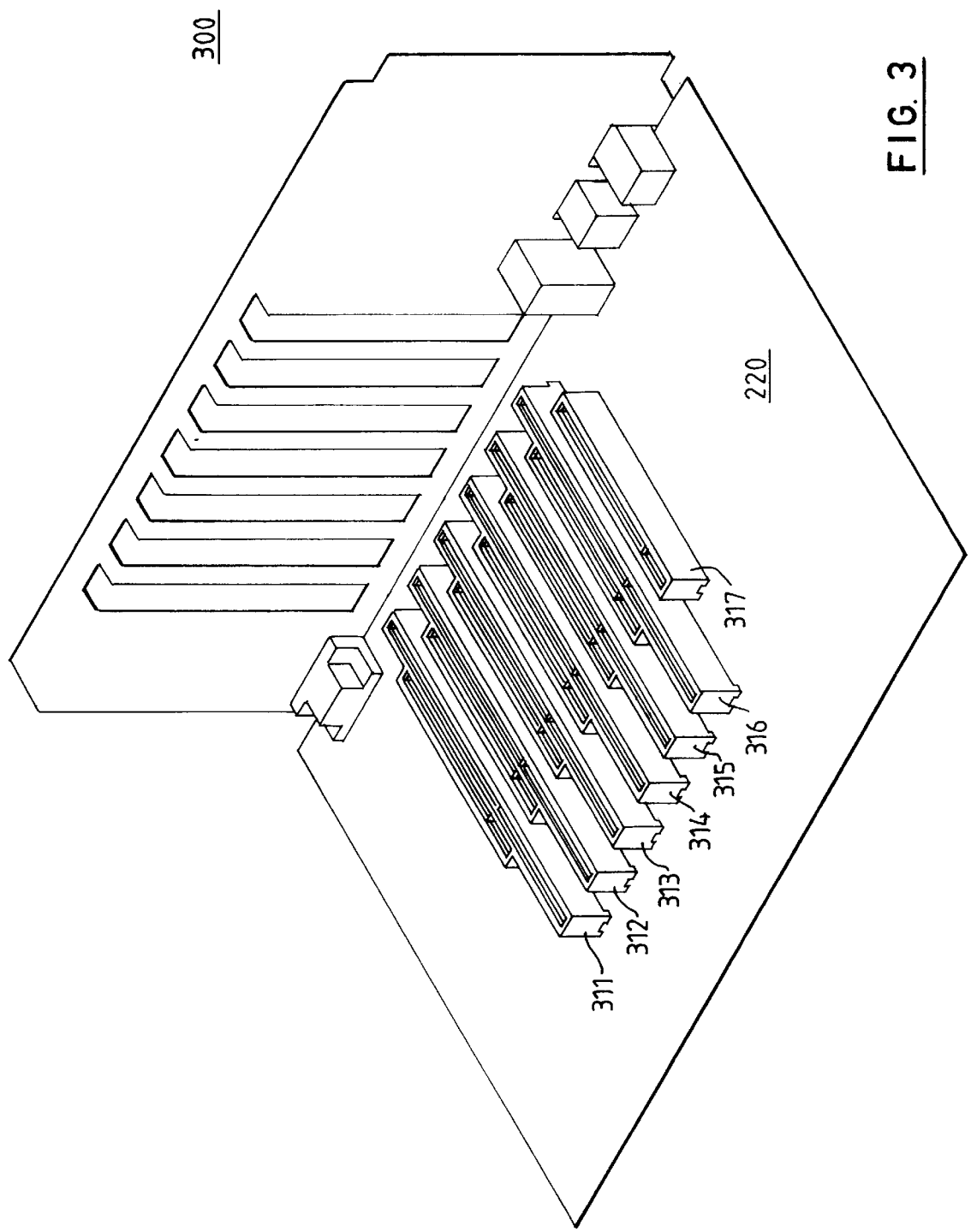
FIG. 3 is a diagram of a system according to the present invention having sockets for EISA and PCI adapter cards arranged on a motherboard.

FIG. 3 shows a perspective view of a system 300 incorporating the present invention. The motherboard 220 has connectors 311 to 317 that allow up to seven adapter cards to be located in the system. This may be seven PCI cards, six EISA cards or any combination of the two types of cards, up to a maximum of seven cards in total. Connectors 311 to 316 will accept PCI cards or EISA cards in the same connector and connector 317 will accept only a PCI card.

Figure 4:
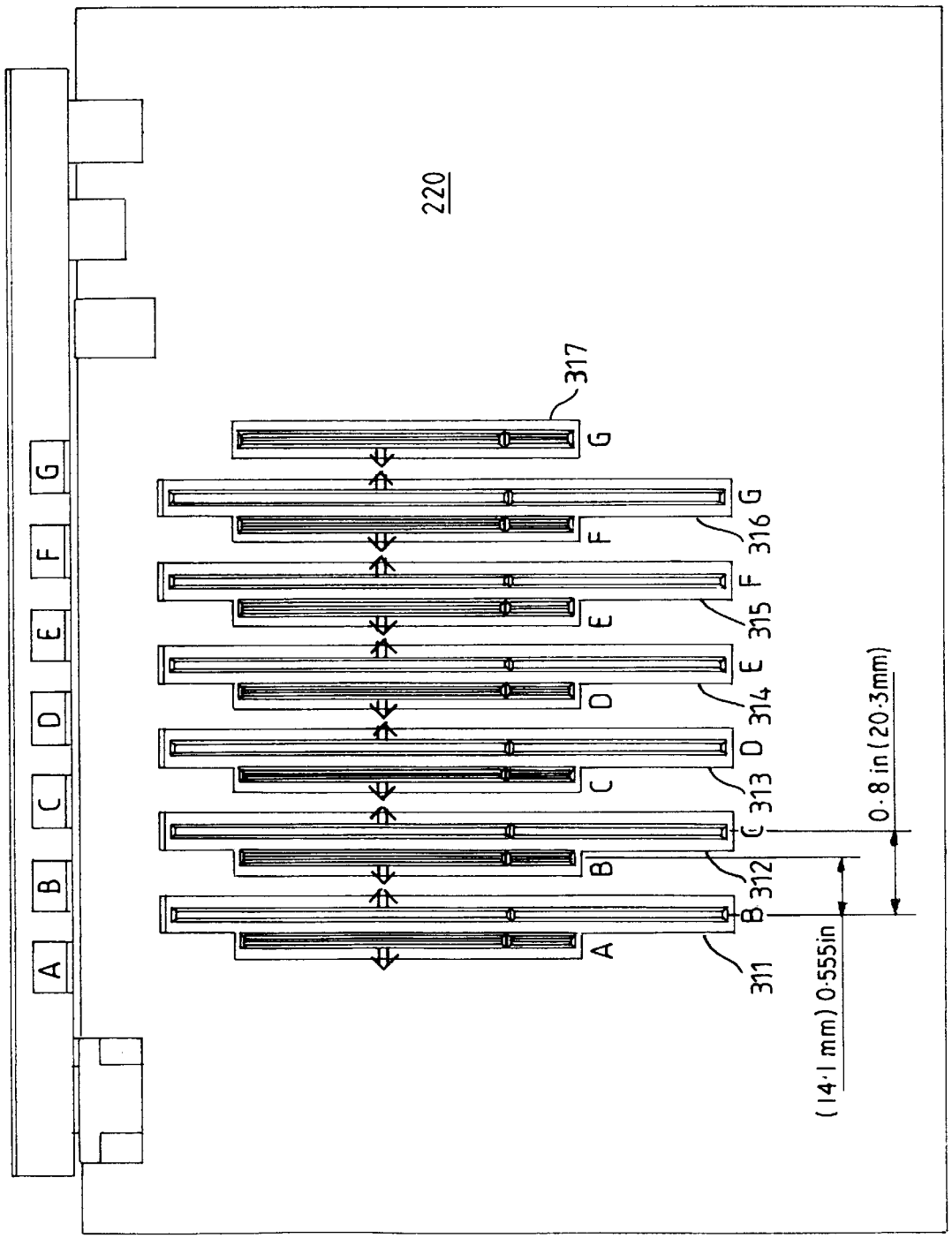
FIG. 4 is a diagram showing the spacing between adjacent connectors for the system of FIG. 3.

FIG. 4 shows the motherboard 220 of the system 200 of FIG. 3 in plan view. Connector 311 comprises a PCI card connector into which a PCI adapter card using the slot labelled "A" may be plugged. The components on the PCI adapter card are on the surface shown by the arrow projecting away from the connector opening. Connector 311 also comprises an ISA or EISA card connector into which an ISA or EISA adapter card using the slot labelled "B" may be plugged. The components on the ISA or EISA adapter card are on the surface shown by the arrow projecting away from the connector opening. Similarly, connector 312 comprise a PCI card connector for slot "B" and an ISA or EISA card connector for slot "C". Connectors 313 to 316 comprise PCI adapter card connectors for slots "C" to "F" and ISA or EISA adapter card connectors for slots "D" to "G" respectively. The PCI adapter card connector for slot "G" is a dedicated PCI card only connector. There is no ISA or EISA adapter card connector for slot "A" and so only PCI cards may be plugged into this slot.

The combined connectors (311 to 316) are spaced at a centre-to-centre distance of 0.8 in (20.3 mm). This gives a spacing between an ISA/EISA connector and the adjacent PCI connector of 0.555 in (14.1 mm). In the embodiment of FIG. 4, this gives a total distance between the PCI portion of combined connector 311 (using slot "A") and the dedicated PCI connector 317 (using slot "G") of 4.80 in (121.8 mm). Within this space are accommodated seven slots. This compares to the prior art of FIG. 2 where the spacing between the PCI connector 214 (using slot "A") and the PCI connector 219 (using slot "F") is 5.00 in (127 mm) and only six slots are accommodated.

The present invention is applicable to a combined connector for any two buses where components are on opposite sides. The presence of components on opposing sides allows the same physical slot to have two connectors located in it. The use of a common insulating moulding for the two connectors for the different buses allows the physical slots to be narrower than would otherwise be the case.

By using a common insulating moulding for the electrical connectors for the PCI bus connector and the ISA or EISA bus connector for a given card slot, the distance between the card centres for a PCI card plugged into a first opening in the insulating moulding of the connector and an ISA or EISA bus plugged into a second opening the same insulating moulding of the connector may be reduced.

FIG. 5 shows a perspective view of the combined connector 500 with a plastic moulding 510 which is common to both the ISA or EISA opening 520 and the PCI opening 530. The plastic moulding is preferably glass filled polyester or nylon or a similar material. Note that the ISA or EISA and the PCI connectors which share a common insulating moulding are actually electrically connected to different slots on the motherboard.

FIG. 6 shows a view of the connector from the direction labelled "6" in FIG. 5. The EISA or ISA opening is shown at the top of the diagram and, spaced a distance of 0.238 in (6.05 mm) apart from it, the PCI opening at the bottom of the diagram. This is a smaller distance than is possible if the two openings did not share a common plastic moulding.

FIG. 7 shows the connection details of the combined connector of the present invention. Two rows of connecting pins 720 are provided for the connections to the ISA or EISA opening of the connector in accordance with the specifications of ISA or EISA buses as is well known in the prior art. Four rows of connecting pins 730 are provided for the connections to the PCI opening of the connector in accordance with the specifications of the PCI bus as is well known in the prior art.

Although an illustrative embodiment and its advantages have been described in detail hereinabove, they have been described as example and not as limitation. Various changes, substitutions and alterations can be made in the illustrative embodiment without departing from the breadth, scope and spirit of the present inventions.

That which is claimed is:

1. A monolith electrical circuit connector for use in a personal computer, the connector arranged so as to accept adapter cards of differing widths adapted for use according to a first standard of architecture and a second standard of PCI architecture, comprising: a first opening of a first width in which an adapter card with components having the first width of a first architecture type may be inserted and a second opening of a second width different to and shorter in width than the first width juxtaposed and disposed parallel to and offset from the first opening, in which an adapter card with components having the second width of a PCI architecture type different than the first standard of architecture may be inserted, the connector formed of an insulating plastic material having an insulating moulding common to moulding structure defining the first opening having the first width and moulding structure defining the second opening having the second width shorter in width than the first width.

2. The connector as defined in claim 1, wherein the first type of adapter card is an ISA adapter card having ISA architecture configuration.

3. The connector as defined in claim 1, wherein the first type of adapter card is an EISA adapter card having EISA architecture configuration.

4. The connector as defined in claim 1, in which the plastic material is glass filled polyester.

5. The connector as defined in claim 1, in which the plastic material is nylon.

6. The connector as defined in claim 1, wherein the first opening and the second opening are spaced apart less than 0.562 inches (14.27 mm) and no less than 0.245 inches (6.2 mm) thereby establishing spacing between assembled adapter card components which provides for compactness and ventilation.

7. The monolith electrical circuit connector as defined in claim 1, wherein the second opening has a first end which is disposed inward of a first end of the first opening and the second opening has a second end which is disposed inward of a second end of the first opening thereby producing the offset of the first and second openings and facilitating ventilation of assembled adapter card components.

8. The connector as defined in claim 7, wherein the first opening and the second opening are spaced apart less than 0.562 inches (14.27 mm) and no less than 0.245 inches (6.2 mm) thereby establishing spacing between assembled adapter card components which provides for compactness and ventilation.

9. The monolith electrical circuit connector as defined in claim 7, wherein the first and second openings are each structured to receive an adapter card with card components in back to back orientation to dispose the assembled adapter card components on opposite sides of each adapter card in a non-facing relationship to facilitate ventilation of the assembled adapter card components.

10. The monolith electrical circuit connector as defined in claim 9, wherein the first and second openings are each structured for electrical connection to different slots on a motherboard of personal computer.

11. A motherboard for use in a personal computer, the motherboard having a processor, memory, data processing controlling elements and a plurality of connectors, each individual connector arranged so as to accept one of a plurality of adapter cards having components for differing protocol standards, the connector having a first opening of a first width in which an adapter card having the first width of a first protocol standard may be inserted and a second opening of a second width different than and shorter in width than the first width juxtaposed and disposed parallel to and offset from the first opening, in which an adapter card having the second width of a PCI protocol standard different than the first protocol standard may be inserted, the connector formed of an insulating plastic material having an insulating moulding common moulding structure defining the first opening having the first width and moulding structure defining the second opening having the second width shorter than the first width.

12. The motherboard as defined in claim 11, wherein the first type of adapter card is an ISA adapter card.

13. The motherboard as defined in claim 11, wherein the first type of adapter card is an EISA adapter card.

14. The motherboard as defined in claim 11, in which the plastic material is glass filled polyester.

15. The motherboard as defined in claim 11, in which the plastic material is nylon.

16. The motherboard as defined in claim 11, wherein two of the plurality of connectors are spaced as close as 0.555 inches (14.1 mm) apart thereby establishing spacing between assembled adapter card components which provides for compactness and ventilation.

17. The motherboard as defined in claim 11, wherein each connector of the plurality of connectors is a monolith electrical circuit connector wherein the second opening has a first end which is disposed inward of a first end of the first opening and the second opening has a second end which is disposed inward of a second end of the first opening thereby producing the offset of the first and second openings and facilitating ventilation of assembled adapter card components.

18. The motherboard as defined in claim 17, wherein two of the plurality of connectors are spaced as close as 0.555 inches (14.1 mm) apart thereby establishing spacing between assembled components which provides for compactness and ventilation of assembled adapter card components.

19. The motherboard as defined in claim 18, wherein the first and second openings of the connector are each structured to receive an adapter card with card components in back to back orientation to dispose the assembled adapter card components on opposite sides of each adapter card in a non-facing relationship to facilitate ventilation of the assembled adapter card components.

20. The motherboard as defined in claim 19, wherein the first and second openings of the monolith connector are each structured to connect to different slots on the motherboard.

* * * * *